United States Patent

Adachi et al.

[11] Patent Number: 5,858,609
[45] Date of Patent: Jan. 12, 1999

US005858609A

[54] IMAGE-FORMING MATERIAL AND METHOD FOR FORMING TRANSFERRED IMAGE

[75] Inventors: Yutaka Adachi; Kunio Shimizu, both of Hino; Tetsuya Masuda; Hideaki Mochizuki, both of Yokohama, all of Japan

[73] Assignees: Konica Corporation; Mitsubishi Chemical Corporation, both of Tokyo, Japan

[21] Appl. No.: 838,033

[22] Filed: Apr. 22, 1997

Related U.S. Application Data

[63] Continuation of Ser. No. 586,361, Jan. 16, 1996, abandoned, which is a continuation of Ser. No. 312,687, Sep. 24, 1994, abandoned, which is a continuation of Ser. No. 9,227, Jan. 26, 1993, abandoned.

[30] Foreign Application Priority Data

Jan. 27, 1992 [JP] Japan ................................. 4-035598

[51] Int. Cl.$^6$ .................................................. G03C 11/12
[52] U.S. Cl. ..................... 430/257; 430/254; 430/271.1
[58] Field of Search ................................... 430/254, 257, 430/271.1, 523, 533, 535

[56] References Cited

U.S. PATENT DOCUMENTS

| | | | |
|---|---|---|---|
| 2,732,301 | 1/1956 | Robertson et al. | 430/287 |
| 3,096,311 | 7/1963 | Merrill et al. | 430/300 |
| 3,453,237 | 7/1969 | Borden et al. | 528/125 |
| 3,775,113 | 11/1973 | Bonham et al. | 430/257 |
| 4,842,950 | 6/1989 | Barton | 430/271 |
| 5,001,034 | 3/1991 | Omote et al. | 430/257 |
| 5,068,689 | 11/1991 | Sasa et al. | 355/107 |

FOREIGN PATENT DOCUMENTS

A-0188228  7/1986  European Pat. Off. .

*Primary Examiner*—Hoa Van Le
*Attorney, Agent, or Firm*—Frishauf, Holtz, Goodman, Langer & Chick, P.C.

[57] ABSTRACT

Disclosed are an image-forming material having a colored light-sensitive layer which may be divided into a colored layer and a light-sensitive layer on a transparent support, characterized in that a transparent support having an orientation angle in the range of −20° to +20° is selectively used, and a method for forming a transferred image using the same.

6 Claims, No Drawings

IMAGE-FORMING MATERIAL AND METHOD FOR FORMING TRANSFERRED IMAGE

This application is a continuation, of application Ser. No. 08/586,361, filed Jan. 16, 1996, now abandoned, which is a continuation of application Ser. No. 08/312,687, filed Sep. 24, 1994, now abandoned, which is a continuation of application Ser. No. 08/009,227, filed Jan. 26, 1993, now abandoned.

BACKGROUND OF THE INVENTION

This invention relates to an image-forming material and a method for forming a transferred image which are suitable for preparing a color proof, more specifically to an image-forming material and a method for forming a transferred image which can provide an image with less positional displacement when one transferred image is prepared by transferring images formed on a large number of sheets, particularly an image with less doubling in color when a multicolor transferred image is prepared.

As a previous step of final printing in multicolor printing, color correction has been generally conducted by a proof print. A light-sensitive transfer sheet for color correction (a color proofing sheet) can be obtained by exposing an image-forming material through a separation screen film for each color printing, developing the exposed material to form a separation image on a light-sensitive layer, and then transferring this separation image to a desired support. Further, a multicolor image can be obtained by repeating a step of transferring a separation image having different color to the above support.

In the prior art, when a color proof is prepared by using an image-forming material, there have been frequently used a method in which positioning is carried out roughly with eyes. According to this method, skill is required, and also it is difficult to obtain stable precision at all times.

There has been known a method for carrying out positioning with stable precision by using a register pin bar. However, even by using a register pin bar, there involve problems that more or less fluctuation of precision is observed, and doubling in color which can be detected visually occurs in some cases. It has been found that such problems are caused remarkably particularly when an image-forming material having a releasing layer on a support is used.

SUMMARY OF THE INVENTION

An object of the present invention is to provide an image-forming material and a method for forming a transferred image which can provide a good image without positional displacement and doubling in color.

The present inventors have studied intensively in order to accomplish the above object, and consequently, the present invention has been made. That is, first, the image-forming material according to the present invention is an image-forming material having a colored light-sensitive layer which may be divided into a colored layer and a light-sensitive layer on a transparent support, characterized in that a transparent support having an orientation angle in the range of −20° to +20° is selectively used. Secondly, the material of the present invention is an image-forming material having a colored light-sensitive layer which may be divided into a colored layer and a light-sensitive layer on a transparent support, characterized in that all orientation angles of the above transparent supports of a set of the image-forming materials used for forming one transferred image are in the range of −20° to +20°.

Further, first, the method for forming a transferred image according to the present invention is a method for forming a transferred image in which color separation images formed by image-forming materials each having a colored light-sensitive layer which may be divided into a colored layer and a light-sensitive layer on a transparent support are transferred to the same support, characterized in that all orientation angles of the above transparent supports of a set of the image-forming materials used for forming one transferred image are in the range of −20° to +20°. Secondly, the method for the present invention is a method for forming a transferred image in which color separation images formed by image-forming materials each having a colored light-sensitive layer which may be divided into a colored layer and a light-sensitive layer on a transparent support are transferred to the same support, characterized in that at least one absolute value of orientation angles of the above transparent supports of a set of the image-forming materials used for forming one transferred image exceeds 20°, all absolute values are 40° or less, and plural sheets of image-forming materials each having a difference between the maximum value and the minimum value of calculated average values of orientation angles at both ends of the respective image-forming materials being within 10° are used. Thirdly, the method for the present invention is a method for forming a transferred image in which color separation images formed by image-forming materials each having a colored light-sensitive layer which may be divided into a colored layer and a light-sensitive layer on a transparent support are transferred to the same support, characterized in that at least one absolute value of orientation angles of the above transparent supports of a set of the image-forming materials used for forming one transferred image exceeds 40°, all absolute values are 50° or less, and plural sheets of image-forming materials each having a difference between the maximum value and the minimum value of calculated average values of orientation angles at both ends of the respective image-forming materials being within 5° are used.

In the present invention, it is a preferred embodiment to use an image-forming material having a releasing layer between the transparent support and the colored light-sensitive layer. When conventional materials of a releasing layer and a support are used (for example, in many cases, a vinyl acetate type copolymer resin is used as a releasing layer and polyethylene terephthalate is used as a support), thermal expansion rate of the releasing layer is larger than that of the support so that positional displacement which is a task to be solved by the present invention is enlarged. In such a case, by using the support having a specific orientation degree of the present invention, the object of the present invention can be accomplished more effectively.

DESCRIPTION OF THE PREFERRED EMBODIMENTS

In the following, the present invention is explained in detail.

(Transparent support)

The support to be used in the present invention may comprise any material so long as the material is transparent and has dimensional stability to water and heat, and may be preferably a polyester film, particularly preferably a biaxially stretched polyethylene terephthalate film. The biaxially stretched polyethylene terephthalate film is required to have an orientation angle in the range of −20° to +20°.

Here, the orientation angle is a value obtained by measuring orientation of polymer molecules fixed during stretching and crystallization of a polyethylene terephthalate film by polarization thereof. The orientation angle can be determined by placing a sample between two polarizing plates and measuring intensity of light transmitted by the sample while rotating the sample. If a film is uniformly stretched in a longer (longitudinal) direction and a width direction, an orientation angle is always 0° in the center of a width direction of a stretched film so that orientation angles of different samples can be compared by using this property. When a sample is rotated between polarizing plates, the angle at which the amount of light transmitted by the sample becomes minimum is an orientation angle of the sample. Orientation angles are bilaterally symmetrical values (only plus and minus signs are different) with the center of a width direction as an axis of symmetry. Further, a value in the center is 0, and an absolute value of an orientation angle becomes larger toward a support end.

The first embodiment of the present invention is to use a support having an orientation angle in the range of −20° to +20° at all positions of an image-forming material to be used. Here, it is more preferred to form a transferred image by selecting an image-forming material (sheet) having a difference between the maximum and minimum values of calculated average values (including plus and minus signs) of orientation angles at a left end and a right end being within 10°.

The second embodiment is to form a transferred image by using image-forming materials in which at least one absolute value of orientation angles of a support exceeds 20° and all absolute values are 40° or less, and plural sheets each having a difference between the maximum and minimum values of calculated average values of orientation angles at both ends being within 10°. Here, it is more preferred that both of a difference between the maximum and minimum values of calculated average values of orientation angles at a left end and said difference at a right end are 20° or less in all sheets to be used.

The third embodiment is to form a transferred image by using image-forming materials in which at least one absolute value of orientation angles of supports exceeds 40° and all absolute values are 50° or less, and plural sheets each having a difference between the maximum and minimum values of calculated average values of orientation angles at both ends being within 5°. Here, it is more preferred that both of a difference between the maximum and minimum values of of calculated average values of orientation angles at a left end and said difference at a right end are 8° or less in all sheets to be used.

The thickness of the support is preferably 10 to 300 μm, more preferably 50 to 100 μm.

(Releasing layer)

In the present invention, in order to improve transfer property of an image formed on a transparent support, a releasing layer is preferably provided on said transparent support. As the releasing layer, there may be used, for example, an ethylene-vinyl acetate copolymer.

As a method for forming the releasing layer by using an ethylene-vinyl acetate copolymer, there may be mentioned a method by coating and drying, a dry lamination method, a hot melt lamination method and a co-extrusion method as disclosed in Japanese Provisional Patent Publication No. 181947/1991.

Additionally, the releasing layer may be formed by using, for example, substances disclosed in Japanese Provisional Patent Publications No. 5101/1976, No. 97140/1984 and No. 2040/1988, for example, alcohol-soluble polyamide, alcohol-soluble Nylon, a blend of a partially esterified resin of a copolymer of styrene and maleic anhydride, and methoxy-methylated Nylon, a polymer of acrylic acid and a derivative thereof, polyvinyl chloride, polyvinyl butyrate and cellulose acetate.

The thickness of the releasing layer is preferably 5 to 200 μm, more preferably 50 to 100 μm.

(Colored light-sensitive layer)

The colored light-sensitive layer may comprise one layer, but it is not necessarily limited to have such a constitution. It may be divided into two layers of a colored layer comprising at least a coloring agent and a binder, and a light-sensitive layer comprising at least a light-sensitive composition and a binder. In that case, either layer may exist at a releasing layer side or a transporting support side. In the following explanation, the colored light-sensitive layer is mainly explained. Therefore, "light-sensitive layer" means a colored light-sensitive layer unless otherwise indicated.

In the light-sensitive layer, a photopolymerizable composition (for a negative type light-sensitive layer), a quinonediazide compound (for a positive type light-sensitive layer), and a diazo compound and an azide compound (for a negative type light-sensitive layer) may be used.

When the light-sensitive layer is formed by using a photopolymerizable composition, a monomer compound such as a polyfunctional vinyl monomer which can form a photopolymer by at least one addition polymerization or a vinylidene compound, and a photopolymerization initiator which is activated by active light are contained in the composition, and, if necessary, a thermal polymerization inhibitor is added thereto.

The vinyl monomer or vinylidene compound which can be used in the photopolymerizable composition is preferably, for example, unsaturated ester of polyol, particularly preferably an acrylate or a methacrylate. Specific examples may include ethylene glycol diacrylate, glycerin triacrylate, polyacrylate, ethylene glycol dimethacrylate, 1,3-propanediol dimethacrylate, polyethylene glycol dimethacrylate, 1,2,4-butanetriol trimethacrylate, trimethylolethane triacrylate, pentaerythritol dimethacrylate, pentaerythritol trimethacrylate, pentaerythritol tetramethacrylate, pentaerythritol diacrylate, pentaerythritol triacrylate, pentaerythritol tetraacrylate, dipentaerythritol polyacrylate, 1,3-propanediol diacrylate, 1,5-pentanediol dimethacrylate, and a bisacrylate and a bismethacrylate of polyethylene glycol having a molecular weight in the range of 200 to 400, which are not limitative.

The photopolymerization initiator and thermal polymerization inhibitor are not particularly limited, and conventionally known compounds may be used.

Next, as the quinonediazide compound to be used for forming the light-sensitive layer, there may be mentioned, for example, an ester compound of o-naphthoquinonediazide-sulfonic acid and a polycondensed resin of a phenol and an aldehyde or a ketone.

As the above phenol, there may be mentioned, for example, a monovalent phenol such as phenol, o-cresol, m-cresol, p-cresol, 3,5-xylenol, carvacrol and thymol; a divalent phenol such as catechol, resorcin and hydroquinone; and a trivalent phenol such as pyrogallol and phloroglucin.

As the above aldehyde, there may be mentioned, for example, formaldehyde, benzaldehyde, acetaldehyde, crotonaldehyde and furfural. Among these aldehydes, preferred are formaldehyde and benzaldehyde.

Further, as the above ketone, there may be mentioned, for example, acetone and methyl ethyl ketone.

As a specific example of the above polycondensed resin, there may be mentioned a phenol-formaldehyde resin, an m-cresol-formaldehyde resin, an m- and p-cresol mixture-formaldehyde resin, a resorcin-benzaldehyde resin and a pyrogallol acetone resin.

In the above o-naphthoquinonediazide compound, the condensation ratio of o-naphthoquinonediazidesulfonic acid to an OH group of the phenol (reactivity based on one OH group) is preferably 15 to 80%, more preferably 20 to 45%.

In consideration of coatability, the above polymer compound containing o-quinonediazide to be used in the present invention preferably has a weight average molecular weight of 1,000 or more, more preferably 1,500 or more.

Also, as the o-quinonediazide compound to be used in the present invention, there may be mentioned a compound described in Japanese Provisional Patent Publication No. 43451/1983.

There may be also used a condensation compound of orthoquinonediazidesulfonic acid and 2,3,4-trihydroxybenzophenone, 2,3,4,4'-tetrahydroxybenzophenone, 2,3,4,2',4'pentahydroxybenzophenone or 2,3,4,3',4',5'-hexahydroxy-benzophenone.

Among the above o-quinonediazide compounds, most preferred is an o-quinonediazide ester compound obtained by reacting 1,2-naphthoquinonediazidesulfonyl chloride, and a condensate of 1,2-naphthoquinonediazidesulfonyl chloride and a pyrogallol-acetone condensed resin or a novolak resin, or 2,3,4-trihydroxybenzophenone.

As the o-quinonediazide compound to be used in the present invention, the above compounds may be used singly or in combination of two or more.

The o-quinonediazide compound is preferably used in an amount of 10 to 40 parts by weight based on 100 parts by weight of a binder of the light-sensitive layer.

The diazo compound is represented by a condensate of p-diazodiphenylamine and formaldehyde, and there may be preferably used diazo compounds which are insoluble in water and soluble in a conventional organic solvent, described in Japanese Patent Publications No. 1167/1972 and No. 43890/1982.

Further, as the azide compound, there may be preferably used an aromatic diazide compound in which an azide group is bonded to an aromatic ring directly or through a carbonyl group or a sulfonyl group. For example, there may be used polyazidestyrene, polyvinyl-p-azidebenzoate and polyvinyl-p-azidebenzal described in U.S. Pat. No. 3,096,311, a reaction product of azidearylsulfonyl chloride and an unsaturated hydrocarbon type polymer described in Japanese Patent Publication No. 9613/1970, and polymers having sulfonylazide or carbonylazide (described in Japanese Patent Publications No. 21017/1968, No. 22954/1969 and No. 24915/1970).

As other negative type light-sensitive composition, there may be mentioned a compound comprising a derivative of cinnamic acid, for example, polyesters or polyamides having —C=C—CO— group described in U.S. Pat. No. 3,453,237, and cinnamates of a polymer having a hydroxyl group such as polyvinyl alcohol and cellulose described in U.S. Pat. No. 2,732,301.

As a binder resin to be used in the light-sensitive layer, there may be representatively mentioned a novolak resin, an acrylic resin, a vinyl acetate resin, a polyurethane resin and an epoxy resin.

As the novolak resin, there may be mentioned, for example, a phenol-cresol-formaldehyde copolycondensed resin as described in Japanese Provisional Patent Publication No. 57841/1980, and a copolycondensed resin of p-substituted phenol, phenol or cresol and formaldehyde described in Japanese Provisional Patent Publication No. 127553/1980. As the vinyl acetate resin, there may be preferably used vinyl acetate-vinyl versatate copolymers described in Japanese Provisional Patent Publications No. 48248/1991 and No. 181947/1991.

In the light-sensitive layer, a suitable coloring agent may be contained. When a coloring agent is used, a dye or a pigment may be generally used. For example, there may be used pigments and dyes of yellow, magenta, cyan and black, and also a metal powder, a white pigment and a fluorescent pigment may be used. In the following, some examples of a large number of pigments and dyes conventionally known in this field of the art are shown. C.I means a color index.

| | |
|---|---|
| Victoria Pure Blue | (C.I 42595) |
| Auramine | (C.I 41000) |
| Carotene Brilliant Flavin | (C.I Basic 13) |
| Rhodamine 6GCP | (C.I 45160) |
| Rhodamine B | (C.I 45170) |
| Safranine OK 70:100 | (C.I 50240) |
| Erioglaucine X | (C.I 42080) |
| Fast Black HB | (C.I 26150) |
| No. 1201 Lionol Yellow | (C.I 21090) |
| Lionol Yellow GRO | (C.I 21090) |
| Symlar Fast Yellow 8GF | (C.I 21105) |
| Benzidine Yellow 4T-564D | (C.I 21095) |
| Symlar Fast Red 4015 | (C.I 12355) |
| Lionol Red 7B4401 | (C.I 15830) |
| Fastgen Blue TGR-L | (C.I 74160) |
| Lionol Blue SM | (C.I 26150) |
| Mitsubishi Carbon Black MA-100 (trade name, produced by Mitsubishi Kasei Corporation) | |
| Mitsubishi Carbon Black #30, #40 and #50 (trade names, produced by Mitsubishi Kasei Corporation) | |
| Cyanine Blue 4920 (produced by Dainichi Seika) | |
| Seika Fast Carmine 1483 (trade name, produced by Dainichi Seika) | |
| Seika Fast Yellow H-7005, 2400 (trade name, produced by Dainichi Seika) | |

When a coloring agent is contained in the light-sensitive layer, the content of the coloring agent is preferably in the range of 5 to 50% by weight based on the total solid of said light-sensitive composition.

When a coloring agent is used, the ratio of the coloring agent to a binder in the light-sensitive layer can be determined in consideration of target optical density and removing property to a developing solution of the light-sensitive layer. For example, in the case of a dye, the ratio is 5% to 75% in terms of weight, and in the case of a pigment, the ratio is generally preferably 5% to 90% in terms of weight.

The film thickness of the light-sensitive layer may be selected depending on target optical density, the kind of a coloring agent (dye, pigment or carbon black) used in the light-sensitive layer and a content thereof. However, when the thickness is as thin as possible, resolving power is heightened and image quality becomes good. Therefore, the film thickness is preferably in the range of 0.1 $\mu$m to 5 $\mu$m.

In addition to the respective materials described above, a plasticizer and a coatability improving agent may be further added to the light-sensitive layer, if necessary.

As the plasticizer, there may be mentioned, for example, various low molecular compounds such as phthalates, triphenylphosphates and maleates. As the coatability improving agent, there may be mentioned, for example, surfactants such as nonionic surfactants represented by ethyl cellulose and polyalkylene ether, and fluorine type surfactants.

The light-sensitive layer can be formed generally by dissolving a light-sensitive composition, a coloring agent, if necessary, and a suitable binder in a suitable solvent to prepare a coating solution, and providing the coating solution on a releasing layer or a transparent support by coating.

In the present invention, the light-sensitive material is preferably formed by providing a coating solution containing methyl lactate or methyl ethyl ketone by coating, but other solvent may be used in combination. When other solvent is used in combination, the content of the solvent used in combination is preferably less than 50% by weight in the solvent to be used.

As a solvent which may be used in combination with methyl lactate or methyl ethyl ketone, there may be used, for example, cyclohexanone, ethylene dichloride, dichloromethane, acetone, methyl isobutyl ketone, ethyl acetate, ethylene glycol monomethyl ether, ethylene glycol monomethyl ether acetate, ethylene glycol monoethyl ether, ethylene glycol monoethyl ether acetate, N,N-dimethylformamide, dimethylsulfoxide, N,N-dimethylacetamide, acetylacetone, dioxane, tetrahydrofuran, γ-butyrolactone, propylene glycol monomethyl ether, propylene glycol monoethyl ether acetate, propylene glycol monoethyl ether acetate, diethylene glycol dimethyl ether and diethylene glycol diethyl ether.

As a coating method for providing the colored light-sensitive layer on a releasing layer and a transparent support by coating, there may be used, for example, various methods such as roll coating, reverse roll coating, dip coating, air knife coating, gravure coating, gravure offset coating, hopper coating, blade coating, rod coating, wire doctor coating, spray coating, curtain coating and extrusion coating.

Further, when plural layers are provided as in the case where the colored light-sensitive layer is divided into a colored layer and a light-sensitive layer or the case where a protective layer is further provided on the colored light-sensitive layer by coating, there may be used a successive multilayer coating method in which each layer is coated, dried and then wound, or a method in which a large number of coaters and driers are arranged in one line, and plural layers are provided by one conveyance of a support (e.g. Japanese Provisional Patent Publication No. 69574/1988).

Drying is carried out by blowing heated air on a coated surface. The heating temperature is preferably 30° to 200° C., particularly suitably in the range of 40° to 140° C. During drying, there may be generally used a method in which a colored light-sensitive layer is dried while maintaining temperature of heated air constantly, but there may be also used a method in which drying is carried out by elevating temperature of heated air stepwise. Further, heated air is preferably supplied on a coated surface at a rate of 0.1 to 30 m/sec, particularly suitably supplied at a rate of 0.5 to 20 m/sec.

(Overcoat layer)

When a photopolymerizable substance is contained in the above colored light-sensitive layer, a protective layer (overcoat layer) which can be dissolved or swelled in a developing solution may be provided on the colored light-sensitive layer in order to prevent polymerization inhibition caused by influence of oxygen. As a resin and other materials to be used in the overcoat layer, there may be mentioned polyvinyl alcohol, polyethylene oxide, polyacrylic acid, polyacrylamide, polyvinyl methyl ether, polyvinyl pyrrolidone, polyamide, gum arabic, glue, gelatin, casein, celluloses (e.g. viscose, methyl cellulose, ethyl cellulose, hydroxyethyl cellulose, hydropropylmethyl cellulose and carboxymethyl cellulose), and starches (e.g. soluble starch and modified starch).

In the present invention, a cover sheet made of a known material may be provided in place of the overcoat layer.

(Method for forming image)

The method for forming an image of the present invention can be carried out as described below by using the above image-forming material.

That is, first, a color separation screen film and a colored image-forming material corresponding to each color are adhered closely, and image exposure is carried out by, for example, irradiating UV ray. As a light source, there may be used a mercury lamp, an ultra-high pressure mercury lamp, a metal halide lamp, a tungsten lamp, a xenon lamp and a fluorescent lamp. For other three colors, this operation is repeated.

Subsequently, each exposed material is subjected to liquid development by using a developing solution, washed and dried to form an image portion.

An image portion may be formed by other method, for example, a method in which peeling development is carried out by peeling a cover sheet in place of liquid development using a developing solution, as disclosed in Japanese Provisional Patent Publication No. 269349/1990.

Subsequently, after an image portion is formed by carrying out exposure and development as described above, a transferred image can be obtained by transferring at least the image portion formed to an image-receiving material (a material to which an image is to be transferred). Preferred is an embodiment that only the image portion formed is transferred.

That is, after a first colored image is formed on a first colored image-forming material, at least the colored image is transferred to an image-receiving material, and a support is peeled off. After a second colored image is formed on a second colored image-forming material, the second colored image formed thereby is transferred to the image-receiving material to which the first colored image has been already transferred while registration is conducted, and a support is peeled off to obtain an image on which two colors are adjusted. In the same manner, a third colored image and a fourth colored image (or more images, if necessary) are transferred to the same image-receiving material to obtain a multicolor image. Further, depending on the case, this multicolor image may be transferred indirectly to other image-receiving material to obtain a final multicolor image. This kind of method is disclosed in Japanese Provisional Patent Publications No. 41830/1972, No. 97140/1984 and No. 23649/1985, and U.S. Pat. No. 3,775,113. In that case, there may be employed an embodiment that only an image portion is transferred from an image formed on a support directly to an image-receiving material and laminated thereon. That is, it is preferred that substantially only an image layer for forming an image is transferred and laminated.

As a transfer method, there may be preferably employed a method described in U.S. Pat. No. 5,068,689. In that case, substantially only an image layer for forming an image is transferred and laminated, and also directly transferred to a final sheet so that one transfer step is decreased as compared with the above indirect transfer method. For this reason, operation time is shortened, and an adhesive image-receiving sheet used in indirect transfer is not used, so that operation of positioning an image-receiving sheet and a support on which an image is formed is facilitated to improve operatability.

Further, transfer is generally carried out by applying heat and/or pressure. The temperature and pressure varies greatly depending on a layer constitution and components constituting the respective layers. In general, the temperature is room temperature to 140° C., and the pressure is about 0 to 20 kg/cm$^2$. However, in the present invention, it is preferred that the temperature is 70° to 100° C., and the pressure is in the range of 3 to 10 kg/cm$^2$. Such conditions can be obtained by various known devices. For example, there may be mentioned a method for passing between heat rolls as disclosed in Japanese Provisional Patent Publication No. 80658/1987. Also, a method disclosed in U.S. Pat. No. 5,068,689 described above may be used preferably.

As a method for positioning (registration), various methods may be used. For example, there may be mentioned a method in which positional displacement is prevented by fixing an image by adhering a support on which an image has been formed closely to an adhesive support, and a method in which registration is conducted with a register pin bar by utilizing a pin hole used for adhering a color separation manuscript during exposure. The former method is described in Japanese Provisional Patent Publications No. 78788/1988 and No. 19148/1990. In the present invention, the latter method using a register pin bar is preferred.

As the image-receiving material (an image-accepting material), there may be used papers such as wood free paper, art paper and coated paper, plastic films such as a polyester film and an acetate film or a plastic film on which a peeling layer and an image-receiving layer are coated, metal foils such as aluminum foil and copper foil, or a composite material thereof.

EXAMPLES

The present invention is described in detail by referring to Example, but the present invention is not limited to Examples described below and includes various embodiments.

Example 1

(Preparation of support)

On a biaxially stretched polyethylene terephthalate film (width: 65 cm) with a thickness of 75 $\mu$m having a previously specified orientation angle (the value of each sample is described below), a releasing layer with a thickness of 25 $\mu$m was formed by extrusion lamination of an ethylenevinyl acetate copolymer resin EVAFLEX P-1405 (trade name, produced by Mitsui-Du Pont Polychemical Co., vinyl acetate content: 14% by weight, VICAT softening point: 68° C.). Physical properties of this support are as described below.

| | |
|---|---|
| Young modulus: | 450 kg/mm$^2$ in longer direction |
| | 460 kg/mm$^2$ in width direction |
| Breaking strength: | 22.0 kg/mm$^2$ in longer direction |
| | 22.5 kg/mm$^2$ in width direction |
| Breaking extension: | 150% in longer direction |
| | 130% in width direction |
| Heating shrinkage (at 150° C. for 30 minutes): | 1.2% in longer direction |
| | 0.9% in width direction |

(Light-sensitive layer 1: positive type light-sensitive layer)

On the support described above, light-sensitive solutions having the following compositions were coated by using a bar coater, and dried to prepare positive type colored image-forming materials of four colors with a dried film thickness of 1.5 $\mu$m.

| | |
|---|---|
| 2,3,4-Trihydroxybenzophenone-naphthoquinone-1,2-diazide-4-sulfonate | 0.616 part by weight |
| Vinyl acetate-vinyl versatate copolymer (80:20% by weight, weight average molecular weight: 50,000, 50% methanol solution) | 8.768 parts by weight |

| -continued | |
|---|---|
| Pigment shown below | |
| Cyclohexanone | 35.2 parts by weight |
| Fluorine type surfactant FC-430 (trade name, produced by 3M Co.) | 0.01 part by weight |

(Pigment)

| | |
|---|---|
| Black: Carbon Black MA-100 (trade name, produced by Mitsubishi Kasei Corporation) | 0.99 part by weight |
| Cyan: Cyanine Blue 4920 (trade name, produced by Dainichi Seika) | 0.55 part by weight |
| Magenta: Seika Fast Carmine 1483 (trade name, produced by Dainichi Seika) | 0.68 part by weight |
| Yellow: Seika Fast Yellow 2400 (trade name, produced by Dainichi Seika) | 0.68 part by weight |

(Method for forming transferred image)

On the polyethylene terephthalate film surfaces of the positive type colored image-forming materials of four colors obtained as described above, color separation screen positive films of the respective colors were superposed. Then, the materials obtained were subjected to image exposure for 20 seconds from a distance of 50 cm by a 4 KW metal halide lamp, and further developed by dipping in a developing solution shown below at 30° C. for 30 seconds to prepare colored images of four colors.

(Developing solution)

| | |
|---|---|
| Konica PS printing developing solution SDP-1 (trade name, produced by Konica Corporation) | 20 ml |
| Pelex NBL (trade name, produced by Kao Atlas Co.) | 50 ml |
| Water | 400 ml |

The size of the image obtained was A1 size (594×841 mm). A sheet to which the image was transferred had pin holes of register pin bars outside of this image in longer side directions and had register marks at four corners of the image and central positions of the respective sides of the image (outside of the image) for the purpose of confirming the size of positional displacement. Thus, the sheet had a size of 650×900 mm and was larger than the image. By using this sheet, a transferred image of four colors was formed on art paper according to the method described in Example 1 of U.S. Pat. No. 5,068,689. Drum and press roll temperatures were 80° C., and roll pressure was 4 kg/cm$^2$.

The image obtained had good transfer property, and was very similar to an image of a print prepared by a conventional offset printing. The print similarity was evaluated as described below. That is, the image obtained and a print obtained by offset printing of the same manuscript according to a conventional manner were compared with naked eyes visually by 10 persons to evaluate print similarity of the transferred image. When 6 or more persons among 10 persons judged that print similarity was good, it was evaluated that the transferred image had good print similarity. As a result, in the case of Sample No. 1 in Table 1 shown below, 8 persons among 10 persons judged that the image had good print similarity.

Next, by using colored image-forming materials having different orientation angles of supports, the above procedure was repeated in the same manner as described above.

For the samples thus obtained, data of the sizes of orientation angles and positional displacements are shown in Table 1 wherein upper, lower, left and right directions are indicated with a side on which a pin hole of a register pin bar is present being an upper side (because a sample is inserted into a transfer machine from this direction). The left and right directions of a sheet correspond to a width direction at the time of preparing a support, so that orientation angles at left and right ends are shown. In the column of orientation angle, values in the upper row show a value of an orientation angle at a left end and a value of an orientation angle at a right end in the form of left end value/right end value, and a value in the lower row shows a calculated average value of a value at a left end and a value at a right end. In the column of difference of average values, a difference between the maximum and minimum values of calculated average values is shown.

Further, positional displacement values are data at four points of left upper, right upper, left lower and right lower, and show values of the largest positional displacements of register marks of four colors.

(Standard of visual observation)
A: no positional displacement (positional displacement is not recognized by 8 or more persons among 10 persons)
B: almost no positional displacement (positional displacement is not recognized by 6 or more persons among 10 persons)
C: positional displacement (positional displacement is not recognized by 4 or more persons among 10 persons)
D: remarkable positional displacement (positional displacement is not recognized by 3 or less persons among 10 persons)

-continued

| | |
|---|---|
| Pentaerythritol tetraacrylate | 4.3 parts by weight |
| Michler's ketone | 0.04 part by weight |
| Benzophenone | 0.25 part by weight |
| Paramethoxyphenol | 0.01 part by weight |
| Methyl cellosolve | 94 parts by weight |
| Fluorine type surfactant FC-430 (trade name, produced by 3M Co.) | 0.01 part by weight |
| Pigment shown below | |

(Pigments)

| | |
|---|---|
| Black: Carbon Black MA-100 (trade name, produced by Mitsubishi Kasei Corporation) | 1.98 parts by weight |
| Cyan: Cyanine Blue 4920 (trade name, produced by Dainichi Seika) | 1.10 parts by weight |
| Magenta: Seika Fast Carmine 1483 (trade name, produced by Dainichi Seika) | 1.36 parts by weight |
| Yellow: Seika Fast Yellow 2400 (trade name, produced by Dainichi Seika) | 1.36 parts by weight |

Next, on the colored light-sensitive layer of the respective colors, an overcoat layer solution having the following composition was coated so as to have a dried film thickness of 0.3 μm by using a bar coater, and dried to obtain negative type colored image-forming materials of four colors.

TABLE 1

| | Orientation angle (°) | | | | | Positional displacement (μm) | | | | |
|---|---|---|---|---|---|---|---|---|---|---|
| Sample No. of Example 1 | Y Left end/ right end | M Left end/ right end | C Left end/ right end | B Left end/ right end | Difference of average values | Left upper | Right upper | Left lower | Right lower | Visual observation |
| Present sample 1 | −18/+8 −5 | −18/+8 −5 | −18/+8 −5 | −18/+8 −5 | 0 | 20 | 20 | 50 | 60 | A |
| Present sample 2 | −18/+8 −5 | +8/−18 −5 | −18/+8 −5 | +8/−18 −5 | 0 | 30 | 30 | 60 | 60 | A |
| Present sample 3 | −9/+16 +3.5 | −9/+16 +3.5 | −9/+16 +3.5 | −9/+16 +3.5 | 0 | 20 | 20 | 60 | 60 | A |
| Present sample 4 | −20/+3 −8.5 | −20/+3 −8.5 | −18/+8 −5 | −18/+8 −5 | 3.5 | 30 | 30 | 60 | 70 | A |
| Present sample 5 | −4/+20 +8 | −4/+20 +8 | −9/+16 +3.5 | −9/+16 +3.5 | 4.5 | 30 | 30 | 60 | 70 | A |
| Present sample 6 | −18/+8 −5 | −18/+8 −5 | −9/+16 +3.5 | −9/+16 +3.5 | 8.5 | 30 | 30 | 70 | 70 | A |
| Present sample 7 | −18/+8 −5 | −18/+8 −5 | −4/+20 +8 | −9/+16 +3.5 | 13 | 30 | 30 | 80 | 90 | B |
| Present sample 8 | −20/+3 −8.5 | −20/+3 −8.5 | −4/+20 +8 | −4/+20 +8 | 16.5 | 30 | 30 | 100 | 90 | B |
| Comparative sample 9 | −18/+8 −5 | −18/+8 −5 | −18/+8 −5 | +2/+22 +12 | 17 | 30 | 40 | 130 | 120 | C |

Example 2
(Light-sensitive layer 2: negative type light-sensitive layer)

On the support used in Example 1, light-sensitive solutions having the following compositions were coated by a bar coater, and dried to obtain colored light-sensitive layers of four colors with a dried film thickness of 1.5 μm.

| | |
|---|---|
| Vinyl acetate-vinyl versatate copolymer (80:20% by weight, weight average molecular weight: 50,000, 50% methanol solution) | 12 parts by weight |

(Composition of overcoat layer solution)

| | |
|---|---|
| Polyvinyl alcohol GL-05 (trade name, produced by Nihon Gosei Kagaku Kogyo) | 6 parts by weight |
| Water | 97 parts by weight |
| Methanol | 3 parts by weight |

Next, color separation negative screen images were adhered closely to the corresponding negative type colored image-forming sheets (colored sheets), respectively. The materials obtained were exposed and then developed to obtain transfer sheets of four colors.

The images and sheets were similar to those obtained in Example 1. By using these, transferred images of four colors were formed on art paper by using the same devices and conditions.

The image obtained had good transfer property, and was very similar to an image of a print prepared by a conventional offset printing. In the case of Sample No. 1 in Table 2 shown below, 8 persons among 10 persons judged that this image had good print similarity.

Data of orientation angles of the supports used and positional displacements are shown in Table 2.

TABLE 2

| | Orientation angle (°) | | | | | Positional displacement (μm) | | | | |
|---|---|---|---|---|---|---|---|---|---|---|
| Sample No. of Example 2 | Y Left end/ right end | M Left end/ right end | C Left end/ right end | B Left end/ right end | Difference of average values | Left upper | Right upper | Left lower | Right lower | Visual observation |
| Present sample 1 | −18/+8 −5 | −18/+8 −5 | −18/+8 −5 | −18/+8 −5 | 0 | 20 | 20 | 60 | 50 | A |
| Present sample 2 | −18/+8 −5 | +8/−18 −5 | −18/+8 −5 | +8/−18 −5 | 0 | 30 | 30 | 60 | 60 | A |
| Present sample 3 | −9/+16 +3.5 | −9/+16 +3.5 | −9/+16 +3.5 | −9/+16 +3.5 | 0 | 20 | 20 | 50 | 60 | A |
| Present sample 4 | −20/+3 −8.5 | −20/+3 −8.5 | −18/+8 −5 | −18/+8 −5 | 3.5 | 30 | 30 | 70 | 70 | A |
| Present sample 5 | −4/+20 +8 | −4/+20 +8 | −9/+16 +3.5 | −9/+16 +3.5 | 4.5 | 30 | 30 | 60 | 70 | A |
| Present sample 6 | −18/+8 −5 | −18/+8 −5 | −9/+16 +3.5 | −9/+16 +3.5 | 8.5 | 30 | 30 | 70 | 70 | A |
| Present sample 7 | −18/+8 −5 | −18/+8 −5 | −4/+20 +8 | −9/+16 +3.5 | 13 | 30 | 30 | 90 | 90 | B |
| Present sample 8 | −20/+3 −8.5 | −20/+3 −8.5 | −4/+20 +8 | −4/+20 +8 | 16.5 | 30 | 30 | 100 | 100 | B |
| Comparative sample 9 | −18/+8 −5 | −18/+8 −5 | −18/+8 −5 | +2/+22 +12 | 17 | 30 | 40 | 130 | 120 | C |

As can be seen from Tables 1 and 2, it can be understood that when an image-forming material (transfer sheet) for preparing a transferred image of four colors in which a support has an orientation angle in the range of ±20° is used, positional displacements after forming a transferred image of four colors are within 100 μm, and an image in which almost no positional displacement is observed visually can be obtained.

Example 3

By using a support having the entirely same characteristics as those of the support of Example 1 except for values of orientation angles of a support, a transferred image of four colors was formed in the entirely same manner as in Example 1. The values of orientation angles and values of positional displacements are shown in Table 3.

Example 4

By using a support having the entirely same characteristics as those of the support of Example 2 except for values of orientation angles of a support, a transferred image of four colors was formed in the entirely same manner as in Example 2. The values of orientation angles and values of positional displacements are shown in Table 4.

In Tables 3 and 4, in the column of difference of average values, values in the upper row show a difference between the maximum value and the minimum value of orientation angles at a right end and a difference of the maximum value and the minimum value of orientation angles at a right end in the form of left end value/right end value. The same explanations as in Tables 1 and 2 can be applied to the remaining columns.

TABLE 3

| | Orientation angle (°) | | | | | Positional displacement (μm) | | | | |
|---|---|---|---|---|---|---|---|---|---|---|
| Sample No. of Example 3 | Y Left end/ right end | M Left end/ right end | C Left end/ right end | B Left end/ right end | Difference of average values | Left upper | Right upper | Left lower | Right lower | Visual observation |
| Present sample 1 | −9/+16 +3.5 | −9/+16 +3.5 | −9/+16 +3.5 | +2/+22 +12 | 11/6 8.5 | 30 | 30 | 60 | 60 | A |
| Present sample 2 | +16/−9 +3.5 | +16/−9 +3.5 | +16/−9 +3.5 | +2/+22 +12 | 14/31 8.5 | 40 | 50 | 80 | 90 | B |

TABLE 3-continued

| Sample No. of Example 3 | Orientation angle (°) | | | | | Positional displacement (μm) | | | | Visual observation |
|---|---|---|---|---|---|---|---|---|---|---|
| | Y Left end/ right end | M Left end/ right end | C Left end/ right end | B Left end/ right end | Difference of average values | Left upper | Right upper | Left lower | Right lower | |
| Present sample 3 | +9/+25 +17 | +9/+25 +17 | +9/+25 +17 | +9/+25 +17 | 0/0 0 | 20 | 20 | 60 | 50 | A |
| Present sample 4 | +9/+25 +17 | +9/+25 +17 | +9/+25 +17 | +25/+9 +17 | 16/16 0 | 40 | 30 | 70 | 70 | A |
| Present sample 5 | −29/−10 −19.5 | −29/−10 −19.5 | −29/−10 −19.5 | −25/−9 −17 | 4/1 2.5 | 30 | 20 | 50 | 60 | A |
| Present sample 6 | −20/+3 −8.5 | −20/+3 −8.5 | −20/+3 −8.5 | −25/−9 −17 | 5/12 8.5 | 30 | 30 | 60 | 60 | A |
| Present sample 7 | +3/−20 −8.5 | −20/+3 −8.5 | −20/+3 −8.5 | −25/−9 −17 | 28/23 8.5 | 50 | 50 | 100 | 90 | B |
| Comparative sample 8 | +28/+36 +32 | +9/+25 +17 | +9/+25 +17 | +9/+25 +17 | 19/11 15 | 40 | 40 | 110 | 110 | C |
| Comparative sample 9 | +28/+36 +32 | +39/+45 +42 | +39/+45 +42 | +39/+45 +42 | 11/9 10 | 50 | 60 | 140 | 160 | D |
| Comparative sample 10 | −42/−35 −38.5 | −42/−35 −38.5 | −35/−25 −30 | −42/−35 −38.5 | 7/10 8.5 | 40 | 40 | 110 | 110 | C |

TABLE 4

| Sample No. of Example 4 | Orientation angle (°) | | | | | Positional displacement (μm) | | | | Visual observation |
|---|---|---|---|---|---|---|---|---|---|---|
| | Y Left end/ right end | M Left end/ right end | C Left end/ right end | B Left end/ right end | Difference of average values | Left upper | Right upper | Left lower | Right lower | |
| Present sample 1 | −9/+16 +3.5 | −9/+16 +3.5 | −9/+16 +3.5 | −2/+22 +12 | 11/6 8.5 | 30 | 30 | 70 | 60 | A |
| Present sample 2 | +16/−9 +3.5 | +16/−9 +3.5 | +16/−9 +3.5 | +2/+22 +12 | 14/31 8.5 | 40 | 40 | 80 | 90 | B |
| Present sample 3 | +9/+25 +17 | +9/+25 +17 | +9/+25 +17 | +9/+25 +17 | 0/0 0 | 20 | 20 | 60 | 50 | A |
| Present sample 4 | +9/+25 +17 | +9/+25 +17 | +9/+25 +17 | +25/+9 +17 | 16/16 0 | 40 | 40 | 70 | 70 | A |
| Present sample 5 | −29/−10 −19.5 | −29/−10 −19.5 | −29/−10 −19.5 | −25/−9 −17 | 4/1 2.5 | 30 | 30 | 60 | 50 | A |
| Present sample 6 | −20/+3 −8.5 | −20/+3 −8.5 | −20/+3 −8.5 | −25/−9 −17 | 5/12 8.5 | 30 | 30 | 60 | 60 | A |
| Present sample 7 | +3/−20 −8.5 | −20/+3 −8.5 | −20/+3 −8.5 | −25/−9 −17 | 28/23 8.5 | 50 | 50 | 90 | 90 | B |
| Comparative sample 8 | +28/+36 +32 | +9/+25 +17 | +9/+25 +17 | +9/+25 +17 | 19/11 15 | 40 | 40 | 110 | 120 | C |
| Comparative sample 9 | +28/+36 +32 | +39/+45 +42 | +39/+45 +42 | +39/+45 +42 | 11/9 10 | 60 | 60 | 150 | 140 | D |
| Comparative sample 10 | −42/−35 −38.5 | −42/−35 −38.5 | −35/−25 −30 | −42/−35 −38.5 | 7/10 8.5 | 40 | 40 | 110 | 120 | C |

As can be seen from Tables 3 and 4, it can be understood that when a transfer sheet for preparing a transferred image of four colors in which at least one absolute value of orientation angles of a support exceeds 20° and all absolute values are 40° or less is used, a transferred image formed by plural sheets each having a difference of the maximum and minimum values of calculated average values of orientation angles at both ends being within 10° has less positional displacement.

Example 5

By using a support having the entirely same characteristics as those of the support of Example 1 except for values of orientation angles, formation of a transferred image according the entirely same manner as in Example 1 was repeated. The values of orientation angles and values of positional displacements are shown in Table 5 (Samples No. 1 to No. 6).

Example 6

By using a support having the entirely same characteristics as those of the support of Example 2 except for values of orientation angles, formation of a transferred image according the entirely same manner as in Example 2 was repeated. The values of orientation angles and values of positional displacements are shown in Table 5 (Samples No. 7 to No. 12).

TABLE 5

| Sample No. of Example 5 and Example 6 | Orientation angle (°) | | | | | Positional displacement (μm) | | | | |
|---|---|---|---|---|---|---|---|---|---|---|
| | Y Left end/ right end | M Left end/ right end | C Left end/ right end | B Left end/ right end | Difference of average values | Left upper | Right upper | Left lower | Right lower | Visual observation |
| Present sample 1 | −42/−35 −38.5 | −42/−35 −38.5 | −45/−39 −42 | −42/−35 −38.5 | 3/4 3.5 | 30 | 30 | 60 | 60 | A |
| Present sample 2 | −42/−35 −38.5 | −35/−42 −38.5 | −45/−39 −42 | −42/−35 −38.5 | 10/7 3.5 | 40 | 40 | 90 | 90 | B |
| Present sample 3 | +44/+48 +46 | +39/+45 +42 | +39/+45 +42 | +39/+45 +42 | 5/3 4 | 40 | 40 | 70 | 80 | A |
| Present sample 4 | +48/+44 +46 | +39/+45 +42 | +39/+45 +42 | +39/+45 +42 | 9/1 4 | 40 | 40 | 100 | 90 | B |
| Comparative sample 5 | +28/+36 +32 | +39/+45 +42 | +39/+45 +42 | +39/+45 +42 | 11/9 10 | 50 | 60 | 140 | 160 | D |
| Comparative sample 6 | −42/−35 −38.5 | −42/−35 −38.5 | −35/−25 −30 | −42/−35 −38.5 | 7/10 8.5 | 40 | 40 | 110 | 110 | C |
| Present sample 7 | −42/−35 −38.5 | −42/−35 −38.5 | −45/−39 −42 | −42/−35 −38.5 | 3/4 3.5 | 30 | 30 | 60 | 60 | A |
| Present sample 8 | −42/−35 −38.5 | −35/−42 −38.5 | −45/−39 −42 | −42/−35 −38.5 | 10/7 3.5 | 30 | 40 | 90 | 90 | B |
| Present sample 9 | +44/+48 +46 | +39/+45 +42 | +39/+45 +42 | +39/+45 +42 | 5/3 4 | 40 | 30 | 80 | 70 | A |
| Present sample 10 | +48/+44 +46 | +39/+45 +42 | +39/+45 +42 | +39/+45 +42 | 9/1 4 | 40 | 40 | 90 | 100 | B |
| Comparative sample 11 | +28/+36 +32 | +39/+45 +42 | +39/+45 +42 | +39/+45 +42 | 11/9 10 | 60 | 60 | 150 | 150 | D |
| Comparative sample 12 | −42/−35 −38.5 | −42/−35 −38.5 | −35/−25 −30 | −42/−35 −38.5 | 7/10 8.5 | 40 | 40 | 100 | 110 | C |

As can be seen from Table 5, it can be understood that when a transfer sheet for preparing a transferred image of four colors in which at least one absolute value of orientation angles of a support exceeds 40° and all absolute values are 50° or less is used, a transferred image formed by plural sheets each having a difference of the maximum and minimum values of calculated average values of orientation angles at both ends being within 5° has less positional displacement.

Example 7

In the entirely same manner as in Example 1 except for providing no releasing layer, formation of a transferred image was repeated. The values of orientation angles and values of positional displacements are shown in Table 6.

Example 8

In the entirely same manner as in Example 2 except for providing no releasing layer, formation of a transferred image was repeated. The values of orientation angles and values of positional displacements are shown in Table 7.

Example 9

In the entirely same manner as in Example 3 except for providing no releasing layer, formation of a transferred image was repeated. The values of orientation angles and values of positional displacements are shown in Table 8.

Example 10

In the entirely same manner as in Example 4 except for providing no releasing layer, formation of a transferred image was repeated. The values of orientation angles and values of positional displacements are shown in Table 9.

Example 11

In the entirely same manner as in Example 5 except for providing no releasing layer, formation of a transferred image was repeated. The values of orientation angles and values of positional displacements are shown in Table 10.

Example 12

In the entirely same manner as in Example 6 except for providing no releasing layer, formation of a transferred image was repeated. The values of orientation angles and values of positional displacements are shown in Table 11.

TABLE 6

| Sample No. of Example 7 | Orientation angle (°) | | | | | Positional displacement (μm) | | | | |
|---|---|---|---|---|---|---|---|---|---|---|
| | Y Left end/ right end | M Left end/ right end | C Left end/ right end | B Left end/ right end | Difference of average values | Left upper | Right upper | Left lower | Right lower | Visual observation |
| Present sample 1 | −18/+8 −5 | −18/+8 −5 | −18/+8 −5 | −18/+8 −5 | 0 | 30 | 20 | 50 | 60 | A |
| Present sample 2 | −20/+3 −8.5 | −20/+3 −8.5 | −18/+8 −5 | −18/+8 −5 | 3.5 | 30 | 30 | 60 | 70 | A |
| Present sample 3 | −18/+8 −5 | −18/+8 −5 | −9/+16 +3.5 | −9/+16 +3.5 | 8.5 | 30 | 30 | 70 | 70 | A |
| Present sample 4 | −18/+8 −5 | −18/+8 −5 | −4/+20 +8 | −9/+16 +3.5 | 13 | 30 | 30 | 80 | 90 | B |

TABLE 6-continued

| Sample No. of Example 7 | Orientation angle (°) | | | | | Positional displacement (μm) | | | | Visual observation |
|---|---|---|---|---|---|---|---|---|---|---|
| | Y Left end/ right end | M Left end/ right end | C Left end/ right end | B Left end/ right end | Difference of average values | Left upper | Right upper | Left lower | Right lower | |
| Comparative sample 5 | −18/+8 −5 | −18/+8 −5 | −18/+8 −5 | +2/+22 +12 | 17 | 30 | 40 | 110 | 110 | C |

TABLE 7

| Sample No. of Example 8 | Orientation angle (°) | | | | | Positional displacement (μm) | | | | Visual observation |
|---|---|---|---|---|---|---|---|---|---|---|
| | Y Left end/ right end | M Left end/ right end | C Left end/ right end | B Left end/ right end | Difference of average values | Left upper | Right upper | Left lower | Right lower | |
| Present sample 1 | −18/+8 −5 | −18/+8 −5 | −18/+8 −5 | −18/+8 −5 | 0 | 20 | 20 | 60 | 60 | A |
| Present sample 2 | −4/+20 +8 | −4/+20 +8 | −9/+16 +3.5 | −9/+16 +3.5 | 4.5 | 30 | 30 | 60 | 70 | A |
| Present sample 3 | −18/+8 −5 | −18/+8 −5 | −9/+16 +3.5 | −9/+16 +3.5 | 8.5 | 30 | 30 | 90 | 90 | B |
| Present sample 4 | −18/+8 −5 | −18/+8 −5 | −4/+20 +8 | −9/+16 +3.5 | 13 | 30 | 30 | 100 | 100 | B |
| Comparative sample 5 | −18/+8 −5 | −18/+8 −5 | −18/+8 −5 | +2/+22 +12 | 17 | 30 | 40 | 120 | 110 | C |

TABLE 8

| Sample No. of Example 9 | Orientation angle (°) | | | | | Positional displacement (μm) | | | | Visual observation |
|---|---|---|---|---|---|---|---|---|---|---|
| | Y Left end/ right end | M Left end/ right end | C Left end/ right end | B Left end/ right end | Difference of average values | Left upper | Right upper | Left lower | Right lower | |
| Present sample 1 | +9/+25 +17 | +9/+25 +17 | +9/+25 +17 | +9/+25 +17 | 0/0 0 | 20 | 30 | 50 | 60 | A |
| Present sample 2 | −9/+16 +3.5 | −9/+16 +3.5 | −9/+16 +3.5 | +2/+22 +12 | 11/6 8.5 | 30 | 30 | 60 | 60 | A |
| Present sample 3 | +16/−9 +3.5 | +16/−9 +3.5 | +16/−9 +3.5 | +2/+22 +12 | 14/31 8.5 | 50 | 40 | 80 | 90 | B |
| Present sample 4 | +3/−20 −8.5 | −20/+3 −8.5 | −20/+3 −8.5 | −25/−9 −17.5 | 28/23 8.5 | 50 | 50 | 100 | 90 | B |
| Comparative sample 5 | +28/+36 +32 | +9/+25 +17 | +9/+25 +17 | +9/+25 +17 | 19/11 15 | 40 | 40 | 100 | 110 | C |
| Comparative sample 6 | +28/+36 +32 | +39/+45 +42 | +39/+45 +42 | +39/+45 +42 | 11/9 10 | 60 | 60 | 130 | 130 | D |

TABLE 9

| Sample No. of Example 10 | Orientation angle (°) | | | | | Positional displacement (μm) | | | | Visual observation |
|---|---|---|---|---|---|---|---|---|---|---|
| | Y Left end/ right end | M Left end/ right end | C Left end/ right end | B Left end/ right end | Difference of average values | Left upper | Right upper | Left lower | Right lower | |
| Present sample 1 | +9/+25 +17 | +9/+25 +17 | +9/+25 +17 | +9/+25 +17 | 0 0 | 20 | 20 | 60 | 60 | A |
| Present sample 2 | −9/+16 +3.5 | −9/+16 +3.5 | −9/+16 +3.5 | +2/+22 +12 | 11/6 8.5 | 30 | 30 | 70 | 70 | A |
| Present sample 3 | +16/−9 +3.5 | +16/−9 +3.5 | +16/−9 +3.5 | +2/+22 +12 | 14/31 8.5 | 40 | 40 | 80 | 90 | B |
| Present sample 4 | +3/−20 −8.5 | −20/+3 −8.5 | −20/+3 −8.5 | −25/−9 −17.5 | 28/23 8.5 | 50 | 50 | 80 | 90 | B |
| Comparative sample 5 | +28/+36 +32 | +9/+25 +17 | +9/+25 +17 | +9/+25 +17 | 19/11 15 | 40 | 40 | 100 | 110 | C |
| Comparative sample 6 | +28/+36 +32 | +39/+45 +42 | +39/+45 +42 | +39/+45 +42 | 11/9 10 | 60 | 60 | 120 | 130 | D |

TABLE 10

| Sample No. of Example 11 | Orientation angle (°) | | | | | Positional displacement (μm) | | | | Visual observation |
|---|---|---|---|---|---|---|---|---|---|---|
| | Y Left end/ right end | M Left end/ right end | C Left end/ right end | B Left end/ right end | Difference of average values | Left upper | Right upper | Left lower | Right lower | |
| Present sample 1 | −42/−35 −38.5 | −42/−35 −38.5 | −45/−39 −42 | −42/−35 −38.5 | 3/4 3.5 | 30 | 30 | 60 | 60 | A |
| Present sample 2 | −42/−35 −38.5 | −35/−42 −38.5 | −45/−39 −42 | −42/−35 −38.5 | 10/7 3.5 | 40 | 40 | 90 | 90 | B |
| Present sample 3 | +44/+48 +46 | +39/+45 +42 | +39/+45 +42 | +39/+45 +42 | 5/3 4 | 40 | 40 | 80 | 80 | A |
| Present sample 4 | +48/+44 +46 | +39/+45 +42 | +39/+45 +42 | +39/+45 +42 | 9/1 4 | 40 | 40 | 90 | 90 | B |
| Comparative sample 5 | +28/+36 +32 | +39/+45 +42 | +39/+45 +42 | +39/+45 +42 | 11/9 10 | 60 | 50 | 130 | 130 | D |
| Comparative sample 6 | −42/−35 −38.5 | −42/−35 −38.5 | −35/−25 −30 | −42/−35 −38.5 | 7/10 8.5 | 50 | 40 | 100 | 110 | C |

TABLE 11

| Sample No. of Example 12 | Orientation angle (°) | | | | | Positional displacement (μm) | | | | Visual observation |
|---|---|---|---|---|---|---|---|---|---|---|
| | Y Left end/ right end | M Left end/ right end | C Left end/ right end | B Left end/ right end | Difference of average values | Left upper | Right upper | Left lower | Right lower | |
| Present sample 1 | −42/−35 −38.5 | −42/−35 −38.5 | −42/−35 −42 | −42/−35 −38.5 | 3/4 3.5 | 30 | 30 | 60 | 60 | A |
| Present sample 2 | −42/−35 −38.5 | −35/−42 −38.5 | −45/−39 −42 | −42/−35 −38.5 | 10/7 3.5 | 40 | 40 | 90 | 90 | B |
| Present sample 3 | +44/+48 +46 | +39/+45 +42 | +39/+45 +42 | +39/+45 +42 | 5/3 4 | 40 | 30 | 70 | 80 | A |
| Present sample 4 | +48/+44 +46 | +39/+45 +42 | +39/+45 +42 | +39/+45 +42 | 9/1 4 | 40 | 40 | 90 | 90 | B |
| Comparative sample 5 | +28/+36 +32 | +39/+45 +42 | +39/+45 +42 | +39/+45 +42 | 11/9 10 | 60 | 60 | 120 | 130 | D |
| Comparative sample 6 | −42/−35 −38.5 | −42/−35 −38.5 | −35/−25 −30 | −42/−35 −38.5 | 7/10 8.5 | 40 | 40 | 110 | 100 | C |

As can be seen from Tables 6 to 11, even when a releasing layer is not used, the object of the present invention can be accomplished. However, as compared with Examples 1 to 6 (using a releasing layer), the degree of preventing positional displacement was smaller and transfer property was inferior since the transferred images were locally stripped off at a support film side. When print similarity was evaluated by the same persons as in Example 1, only 4 persons among 10 persons judged that print similarity was good.

Example 13

Under the same conditions as in Example 1 except for using a method described in Comparative example 1 of U.S. Pat. No. 5,068,689 as a transfer device, a transferred image was formed.

The results are shown in Table 12. Transfer conditions were the same as in Example 1, and both temperatures of upper and lower nip rolls were 80° C. and roll pressure was 4 kg/cm².

In this method, it was necessary to peel off a support film on a receiving stand, and operatability was inferior to that of the method shown in Example 1. Further, when the color proof image obtained was observed, a paper to which an image was transferred was locally stripped off at a support film side. When print similarity of the image of Sample No. 1 in Table 12 was evaluated by the same persons as in Example 1, only 5 persons among 10 persons judged that print similarity was good. However, as to prevention of positional displacement, the effect similar to that of Example 1 could be obtained.

TABLE 12

| Sample No. of Example 13 | Orientation angle (°) | | | | | Positional displacement (μm) | | | | Visual observation |
|---|---|---|---|---|---|---|---|---|---|---|
| | Y Left end/ right end | M Left end/ right end | C Left end/ right end | B Left end/ right end | Difference of average values | Left upper | Right upper | Left lower | Right lower | |
| Present sample 1 | −18/+8 −5 | −18/+8 −5 | −18/+8 −5 | −18/+8 −5 | 0 | 20 | 20 | 60 | 60 | A |
| Present sample 2 | −20/+3 −8.5 | −20/+3 −8.5 | −18/+8 −5 | −18/+8 −5 | 3.5 | 30 | 30 | 70 | 60 | A |
| Present | −18/+8 | −18/+8 | −4/+20 | −9/+16 | 13 | 30 | 30 | 80 | 90 | B |

TABLE 12-continued

|  | Orientation angle (°) | | | | | Positional displacement (μm) | | | | |
|---|---|---|---|---|---|---|---|---|---|---|
| Sample No. of Example 13 | Y Left end/ right end | M Left end/ right end | C Left end/ right end | B Left end/ right end | Difference of average values | Left upper | Right upper | Left lower | Right lower | Visual observation |
| sample 3 | −5 | −5 | 18 | +3.5 | | | | | | |
| Comparative sample 4 | −18/+8 −5 | −18/+8 −5 | −18/+8 −5 | +2/+22 +12 | 17 | 30 | 40 | 130 | 130 | C |

Examples 14 to 18

By using the same transfer sheets as in Examples 2 to 6, respectively, transfer operation was carried out in the same manner as in Example 13 to obtain transferred images of four colors. The results are shown in Tables 13 to 17.

TABLE 13

|  | Orientation angle (°) | | | | | Positional displacement (μm) | | | | |
|---|---|---|---|---|---|---|---|---|---|---|
| Sample No. of Example 14 | Y Left end/ right end | M Left end/ right end | C Left end/ right end | B Left end/ right end | Difference of average values | Left upper | Right upper | Left lower | Right lower | Visual observation |
| Present sample 1 | −18/+8 −5 | −18/+8 −5 | −18/+8 −5 | −18/+8 −5 | 0 | 20 | 20 | 60 | 60 | A |
| Present sample 2 | −4/+20 +8 | −4/+20 +8 | −9/+16 +3.5 | −9/+16 +3.5 | 4.5 | 30 | 30 | 60 | 70 | A |
| Present sample 3 | −18/+8 −5 | −18/+8 −5 | −4/+20 +8 | −9/+16 +3.5 | 13 | 30 | 30 | 90 | 80 | B |
| Comparative sample 4 | −18/+8 −5 | −18/+8 −5 | −18/+8 −5 | +2/+22 +12 | 17 | 30 | 40 | 130 | 120 | C |

TABLE 14

|  | Orientation angle (°) | | | | | Positional displacement (μm) | | | | |
|---|---|---|---|---|---|---|---|---|---|---|
| Sample No. of Example 15 | Y Left end/ right end | M Left end/ right end | C Left end/ right end | B Left end/ right end | Difference of average values | Left upper | Right upper | Left lower | Right lower | Visual observation |
| Present sample 1 | +9/+25 +17 | +9/+25 +17 | +9/+25 +17 | +9/+25 +17 | 0/0 0 | 20 | 20 | 60 | 60 | A |
| Present sample 2 | −9/+16 +3.5 | −9/+16 +3.5 | −9/+16 +3.5 | +2/+22 +12 | 11/6 8.5 | 30 | 30 | 60 | 60 | A |
| Present sample 3 | +16/−9 +3.5 | +16/−9 +3.5 | +16/−9 +3.5 | +2/+22 +12 | 14/31 8.5 | 40 | 40 | 80 | 90 | B |
| Present sample 4 | +3/−20 −8.5 | −20/+3 −8.5 | −20/+3 −8.5 | −25/−9 −17 | 28/23 8.5 | 50 | 50 | 100 | 90 | B |
| Comparative sample 5 | +28/+36 +32 | +9/+25 +17 | +9/+25 +17 | +9/+25 +17 | 19/11 15 | 40 | 40 | 110 | 110 | C |
| Comparative sample 6 | +28/+36 +32 | +39/+45 +42 | +39/+45 +42 | +39/+45 +42 | 11/9 10 | 60 | 60 | 140 | 160 | D |

TABLE 15

|  | Orientation angle (°) | | | | | Positional displacement (μm) | | | | |
|---|---|---|---|---|---|---|---|---|---|---|
| Sample No. of Example 16 | Y Left end/ right end | M Left end/ right end | C Left end/ right end | B Left end/ right end | Difference of average values | Left upper | Right upper | Left lower | Right lower | Visual observation |
| Present sample 1 | +9/+25 +17 | +9/+25 +17 | +9/+25 +17 | +9/+25 +17 | 0/0 0 | 20 | 20 | 60 | 60 | A |
| Present sample 2 | −9/+16 +3.5 | −9/+16 +3.5 | −9/+16 +3.5 | +2/+22 +12 | 11/6 8.5 | 30 | 30 | 60 | 70 | A |

TABLE 15-continued

| | Orientation angle (°) | | | | | Positional displacement (μm) | | | | |
|---|---|---|---|---|---|---|---|---|---|---|
| Sample No. of Example 16 | Y Left end/ right end | M Left end/ right end | C Left end/ right end | B Left end/ right end | Difference of average values | Left upper | Right upper | Left lower | Right lower | Visual observation |
| Present sample 3 | +16/−9 +3.5 | +16/−9 +3.5 | +16/−9 +3.5 | +2/+22 +12 | 14/31 8.5 | 40 | 40 | 80 | 90 | B |
| Present sample 4 | +3/−20 −8.5 | −20/+3 −8.5 | −20/+3 −8.5 | −25/−9 −17 | 28/23 8.5 | 50 | 50 | 90 | 90 | B |
| Comparative sample 5 | +28/+36 +32 | +9/+25 +17 | +9/+25 +17 | +9/+25 +17 | 19/11 15 | 40 | 40 | 120 | 120 | C |
| Comparative sample 6 | +28/+36 +32 | +39/+45 +42 | +39/+45 +42 | +39/+45 +42 | 11/9 10 | 60 | 60 | 150 | 140 | D |

TABLE 16

| | Orientation angle (°) | | | | | Positional displacement (μm) | | | | |
|---|---|---|---|---|---|---|---|---|---|---|
| Sample No. of Example 17 | Y Left end/ right end | M Left end/ right end | C Left end/ right end | B Left end/ right end | Difference of average values | Left upper | Right upper | Left lower | Right lower | Visual observation |
| Present sample 1 | −42/−35 −38.5 | −42/−35 −38.5 | −45/−39 −42 | −42/−35 −38.5 | 3/4 3.5 | 30 | 30 | 60 | 60 | A |
| Present sample 2 | −42/−35 −38.5 | −35/−42 −38.5 | −45/−39 −42 | −42/−35 −38.5 | 10/7 3.5 | 40 | 40 | 90 | 90 | B |
| Present sample 3 | +44/+48 +46 | +39/+45 +42 | +39/+45 +42 | +39/+45 +42 | 5/3 4 | 40 | 40 | 70 | 70 | A |
| Present sample 4 | +48/+44 +46 | +39/+45 +42 | +39/+45 +42 | +39/+45 +42 | 9/1 4 | 40 | 40 | 90 | 100 | B |
| Comparative sample 5 | +28/+36 +32 | +39/+45 +42 | +39/+45 +42 | +39/+45 +42 | 11/9 10 | 60 | 50 | 150 | 160 | D |
| Comparative sample 6 | −42/−35 −38.5 | −42/−35 −38.5 | −35/−25 −30 | −42/−35 −38.5 | 7/10 8.5 | 40 | 40 | 110 | 110 | C |

TABLE 17

| | Orientation angle (°) | | | | | Positional displacement (μm) | | | | |
|---|---|---|---|---|---|---|---|---|---|---|
| Sample No. of Example 18 | Y Left end/ right end | M Left end/ right end | C Left end/ right end | B Left end/ right end | Difference of average values | Left upper | Right upper | Left lower | Right lower | Visual observation |
| Present sample 1 | −42/−35 −38.5 | −42/−35 −38.5 | −45/−39 −42 | −42/−35 −38.5 | 3/4 3.5 | 30 | 30 | 60 | 60 | A |
| Present sample 2 | −42/−35 −38.5 | −35/−42 −38.5 | −45/−39 −42 | −42/−35 −38.5 | 10/7 3.5 | 30 | 40 | 90 | 90 | B |
| Present sample 3 | +44/+48 +46 | +39/+45 +42 | +39/+45 +42 | +39/+45 +42 | 5/3 4 | 40 | 40 | 80 | 70 | A |
| Present sample 4 | +48/+44 +46 | +39/+45 +42 | +39/+45 +42 | +39/+45 +42 | 9/1 4 | 40 | 40 | 90 | 100 | B |
| Comparative sample 5 | +28/+36 +32 | +39/+45 +42 | +39/+45 +42 | +39/+45 +42 | 11/9 10 | 60 | 60 | 150 | 150 | D |
| Comparative sample 6 | −42/−35 −38.5 | −42/−35 −38.5 | −35/−25 −30 | −42/−35 −38.5 | 7/10 8.5 | 40 | 40 | 110 | 110 | C |

Even in these cases, it was observed that a paper to which an image was transferred was locally stripped off at a support film side. However, as to prevention of positional displacement, the effect similar to that of the case where the same transfer device as in Example 1 was used could be obtained.

According to the present invention, an image-forming material and a method for forming a transferred image which can provide a good image without positional displacement and doubling in color can be provided.

We claim:

1. A method for forming a transferred image having a plurality of colors on an image-receiving support by use of a plurality of image-forming sheets comprising:

forming a colored image on each of said image-forming sheets, the resulting colored images on each of said sheets being of different colors wherein each of said colored image-forming sheets comprises a coloring agent, a light-sensitive composition and a binder on a transparent, biaxially stretched polyethylene terephthalate support, and each of the plurality of transparent supports has an orientation angle in the range of −20° to +20°; and successively transferring to said image-receiving support each of the colored images formed on each of said transparent supports by applying thereto heat, pressure or a combination of heat and pressure, so as to form on said image-receiving support said transferred image having a plurality of colors.

2. The method of claim 1 wherein the image-forming material has a releasing layer between the transparent support and the coloring agent and the light-sensitive composition.

3. A method for forming a transferred image which has a plurality of colors on an image-receiving support by use of a plurality of image-forming sheets comprising:

forming a colored image on each of said image-forming sheets, the resulting colored images on each of said sheets being of different colors wherein each of said colored image-forming sheets comprises a coloring agent, a light-sensitive composition and a binder on a transparent, biaxially stretched polyethylene terephthalate support, and each of the plurality of transparent supports has an absolute value of an orientation angle of 40° or less, one of said colored image-forming sheets has a transparent support having an absolute value of an orientation angle exceeding 20°, and there is a difference between the maximum value and the minimum value of calculated average values of orientation angles at both ends of the respective image-forming sheets of 10° or less, a direction between said both ends corresponding to a width direction when said transparent support is prepared; and successively transferring to said image-receiving support each of the colored images formed on each of said transparent supports by applying thereto heat, pressure or a combination of heat and pressure, so as to form on said image-receiving support said transferred image having a plurality of colors.

4. The method of claim 3 wherein the image-forming material has a releasing layer between the transparent support and the coloring agent and the light-sensitive composition.

5. A method for forming a transferred image which has a plurality of colors on an image-receiving support by use of a plurality of image-forming sheets comprising:

forming a colored image on each of said image-forming sheets, the resulting colored images for each of said sheets being of different colors, wherein each of said colored image-forming sheets comprises a coloring agent, a light-sensitive composition and a binder on a transparent, biaxially stretched polyethylene terephthalate support and each of the plurality of transparent supports has a absolute value of an orientation angle of 50° or less, one of said colored image-forming sheets has a transparent support having a absolute value of an orientation angle exceeding 40°, and there is a difference between the maximum value and the minimum value of calculated average values of orientation angles at both ends of the respective image-forming sheets of 5° or less, a direction between said both ends corresponding to a width direction when said transparent support is prepared; and successively transferring to said image-receiving support each of the colored images formed on each of said transparent supports by applying thereto heat, pressure or a combination of heat and pressure, so as to form on said image-receiving support said transferred image having a plurality of colors.

6. The method of claim 5 wherein the image-forming material has a releasing layer between the transparent support and the coloring agent and the light-sensitive composition.

* * * * *